(12) United States Patent
Test

(10) Patent No.: US 8,530,279 B2
(45) Date of Patent: Sep. 10, 2013

(54) OFFSET GRAVURE PRINTING PROCESS FOR IMPROVED MOLD COMPOUND AND DIE ATTACH ADHESIVE ADHESION ON LEADFRAME SURFACE USING SELECTIVE ADHESION PROMOTER

(75) Inventor: Howard Raeburn Test, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 694 days.

(21) Appl. No.: 12/208,755

(22) Filed: Sep. 11, 2008

(65) Prior Publication Data

US 2010/0062570 A1  Mar. 11, 2010

(51) Int. Cl.
*H01L 21/00* (2006.01)

(52) U.S. Cl.
USPC ........... 438/111; 438/112; 438/118; 438/123; 257/E21.001

(58) Field of Classification Search
USPC ........................................................ 438/111
See application file for complete search history.

(56) References Cited

U.S. PATENT DOCUMENTS

| | | | |
|---|---|---|---|
| 3,067,056 A * | 12/1962 | Remer | 427/152 |
| 5,459,103 A | 10/1995 | Kelleher et al. | |
| 5,816,158 A * | 10/1998 | Ross | 101/324 |
| 5,923,957 A * | 7/1999 | Song et al. | 438/118 |
| 6,013,535 A * | 1/2000 | Moden et al. | 438/15 |
| 6,732,643 B2 * | 5/2004 | Kwon et al. | 101/170 |
| 7,049,176 B2 * | 5/2006 | Oda et al. | 438/119 |
| 2003/0140485 A1 * | 7/2003 | Yamazaki et al. | 29/740 |
| 2006/0110855 A1 | 5/2006 | Kwan et al. | |
| 2007/0164405 A1 | 7/2007 | Abbott | |
| 2007/0205518 A1 * | 9/2007 | Bauer et al. | 257/777 |
| 2008/0122049 A1 | 5/2008 | Zhao et al. | |

* cited by examiner

*Primary Examiner* — Michael Jung
(74) *Attorney, Agent, or Firm* — Steven A. Shaw; W. James Brady; Frederick J. Telecky, Jr.

(57) ABSTRACT

Placement of an encapsulation material adhesion promoter onto a semiconductor device leadframe can be performed through the use of an offset printing apparatus such as a rotogravure printing apparatus or a tampoprint printing apparatus. This can provide accurate and low-cost placement of the adhesion promoter.

12 Claims, 2 Drawing Sheets

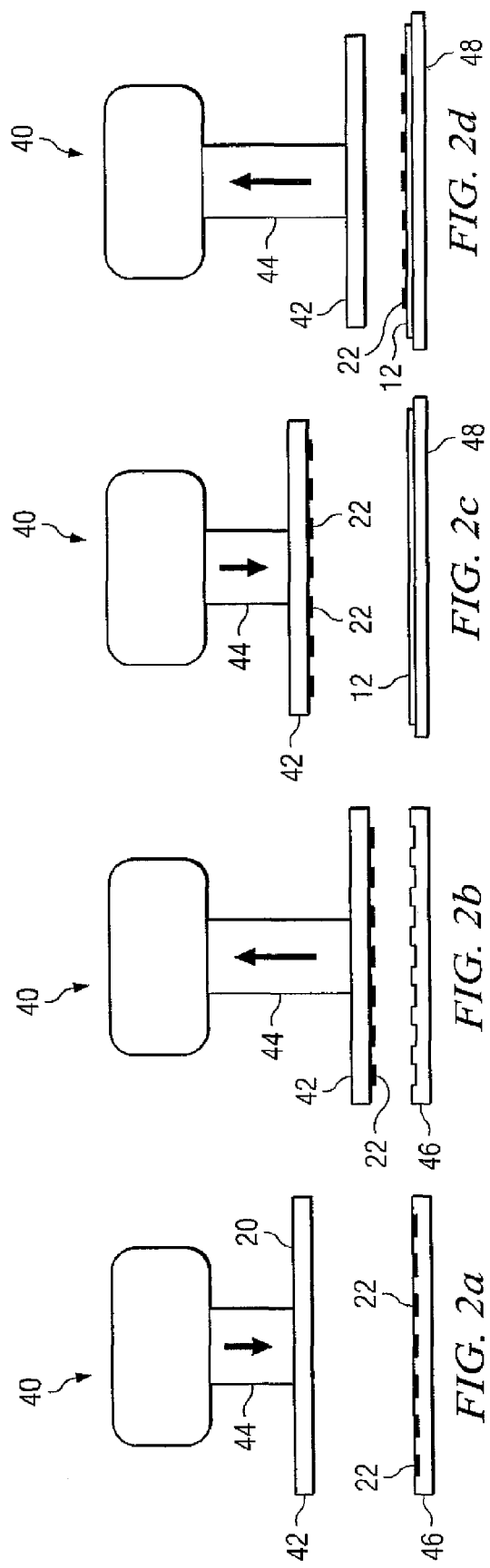

OFFSET GRAVURE PRINTING PROCESS FOR IMPROVED MOLD COMPOUND AND DIE ATTACH ADHESIVE ADHESION ON LEADFRAME SURFACE USING SELECTIVE ADHESION PROMOTER

FIELD OF THE INVENTION

The present invention relates in general to the field of semiconductor device packaging, and more specifically to device encapsulation with a mold compound.

BACKGROUND OF THE INVENTION

A leadframe-based semiconductor device package is the most widely used integrated circuit (IC) package. The leadframe typically includes a chip mount pad (also referred to as a die paddle) for attaching the IC die or chip to the leadframe, and a plurality of lead fingers or conductive segments which provide a conductive path between the chip and external circuits. A gap between the inner end of the lead fingers and the chip is typically bridged with bond wires attached to bond pads on the chip and to the inner end of the lead fingers. Bond wires can be formed from various materials, such as gold, copper, aluminum, or an alloy thereof. The outer ends of the lead fingers remote from the IC chip can be electrically and mechanically connected to external circuitry. After assembly of the chip to the leadframe, the chip, the bond wires, and a portion of the leadframe can be encapsulated in mold compound.

As the encapsulated semiconductor device undergoes temperature cycling during device testing or use, it is known that thermomechanical stresses are induced at the joints or interfaces between dissimilar materials used in the fabrication of the device. The stresses are primarily induced due to differences between the coefficients of thermal expansion (CTE) of the various materials. For example, metal used to fabricate the leadframe assembly expands or contracts differently than plastic resin material used as the mold compound, thereby causing delamination of the mold compound from the leadframe. These stresses, which may be repeatedly induced during hundreds or thousands of temperature cycles, tend to fatigue the joints and the interfaces, and can result in separation between the leadframe and the mold compound. If delamination occurs, the device can fail as a result of physical damage during separation or from corrosion resulting from the intrusion of moisture into the delaminated package.

Various strategies are used to reduce delamination of the mold compound from the leadframe. One technique comprises optimizing the formulation of the mold compound to provide increased adhesion to the leadframe surface. Another technique comprises roughening the leadframe surface using chemical or mechanical processes. Yet another method comprises the application of a liquid adhesion promoter to the leadframe, conventionally using a stencil mask to avoid applying the liquid to the wire bond areas of the inner lead fingers and to the outer lead fingers which will be external to the encapsulation material.

SUMMARY OF THE EMBODIMENTS

The Applicant has discovered that application of an offset printing process to pattern an encapsulation material adhesion promoter onto a leadframe has advantages over conventional processing. In one embodiment, an offset rotogravure (gravure) printing process is used to pattern an adhesion promoter onto a leadframe in an accurate and low-cost process. A leadframe is passed between an impression cylinder and a printing cylinder of a gravure printing apparatus to transfer a pattern of material from the printing cylinder to the leadframe.

Applicant has realized that while prior methods of reducing delamination can be effective, they are also expensive and can contribute to yield loss. For example, during application of the adhesion promoter using a stencil mask, the material can flow under the mask. If the underflow material reaches the wire bond areas of the inner leads, wire bond attachment can be defective and result in an unreliable or nonfunctional device. Similarly, the lead portions which will be exterior to the encapsulation material must be kept free from adhesion promoter to ensure proper electrical connection to an electronic device which will receive the completed encapsulated semiconductor device.

In an embodiment of the invention, the adhesion promoter is applied using a tampoprint or rotogravure printing process, which is less prone to the application of material at undesired locations on the leadframe than is found with the use of a stencil mask.

An embodiment of the invention using a tampoprint or rotogravure printing process also provides for accurate placement of the adhesion promoter without the use of lithography. Lithographic processes require the use of both a photoresist and a solvent, physical transfer of the leadframe to apply and pattern the resist, and handling of individual leadframes to apply the resist which is time consuming and therefore expensive. The printing process of various embodiments of the present invention use only printing equipment and adhesion promoter, and therefore no sacrificial material such as photoresist and solvent must be purchased or disposed of.

Additionally, the printing process of an embodiment of the invention eliminates the need for chemical or mechanical alteration of the leadframe as is required with processes which roughen the leadframe surface through the use of etchants. Purchase and disposal of etchants used with prior chemical roughening processes is expensive. Further, various embodiments of the present process do not use mechanical means to roughen the leadframe, which can result in damage through overly aggressive material removal, and can result in residual metallic contamination which must be removed or can result in conductive shorts.

It is a technical advantage of various embodiments of the invention that the application of a liquid adhesion promoter using a printing process is simple and low-cost, has a high throughput, low waste, and which does not require sacrificial materials which are not used on the completed device.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIG. 2 is a schematic cross section depicting a second embodiment of the invention using an offset tampoprint printing apparatus to place an adhesion promoter on a leadframe.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

The Applicant realizes that a new approach needs to be taken for the application of an adhesion promoter to a leadframe which allows for an accurate, low cost placement of the material. Reference will now be made in detail to the present embodiments (exemplary embodiments) of the invention, examples of which are illustrated in the accompanying drawings. Wherever possible, the same reference numbers will be used throughout the drawings to refer to the same or like parts.

Figure 1:
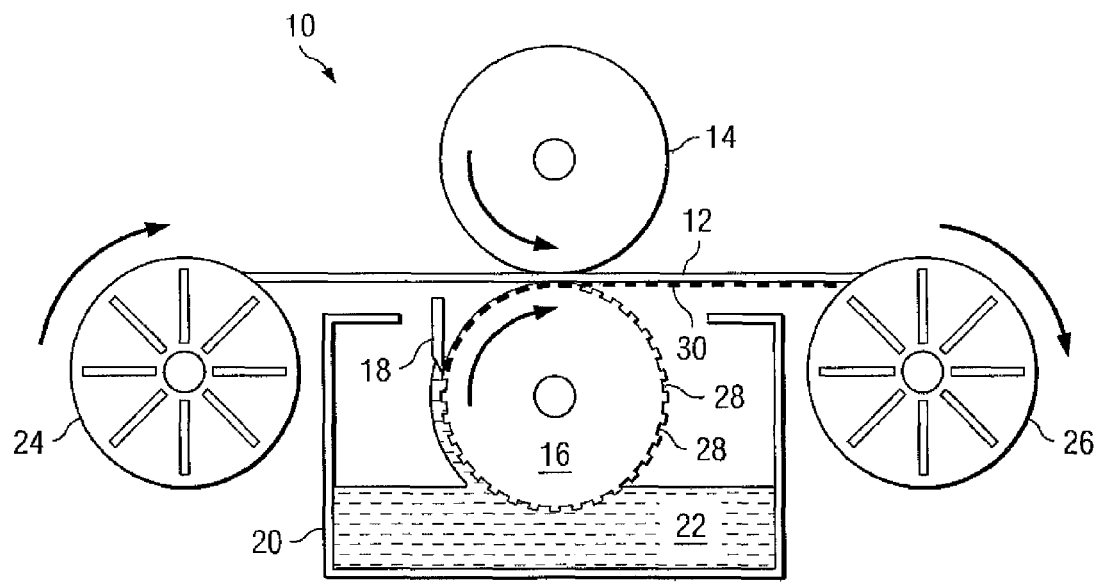
FIG. 1 is a schematic cross section depicting a first embodiment of the invention using an offset rotogravure printing apparatus to place an adhesion promoter on a leadframe.

FIG. 1 depicts the use of an offset rotogravure (gravure) printing apparatus 10 to accurately place a liquid adhesion promoter at desired location onto a leadframe 12, while minimizing placement at undesired locations. The gravure printing apparatus comprises an impression cylinder 14, a printing cylinder 16, a doctor blade 18, and a reservoir 20 containing a quantity of adhesion promoter 22. FIG. 1 further depicts a first leadframe reel 24 (storage reel) which stores a plurality of leadframes connected as a single strip in tape fashion prior to application of the adhesion promoter, and a second leadframe reel 26 (take-up reel) which receives the leadframe strip subsequent to application of the adhesion promoter.

In use, a printing cylinder 16 is manufactured with a pattern 28 suitable for placing the adhesion promoter 22 onto desired locations of each leadframe. The printing cylinder is then assembled into the printing apparatus 10 in accordance with known techniques. The first leadframe reel 24 is loaded into the printing apparatus 10, and the leading edge of the leadframe tape 12 is fed into between the impression cylinder 14 and the printing cylinder 16. A leadframe handler will typically be used to assist placement of the leadframe into and through the printing apparatus. The leading edge is then secured into the second leadframe reel 26, which stores the leadframe tape 12 subsequent to application of the adhesion promoter.

The gravure printing apparatus 10 is engaged such that the impression cylinder 14 and/or the printing cylinder 16 rotate, along with the second reel 26, to urge the leadframe tape 12 between the two cylinders 14, 16 and advance the leadframe through the printing apparatus and on to the second reel 26. During rotation, a quantity of adhesion promoter 22 is received into depressions 28 in the printing cylinder 16 from the reservoir 20. Excess adhesion promoter is removed from the printing cylinder 16 by the doctor blade 18. As the leadframe 12 progresses between the two cylinders 14, 16, the adhesion promoter within the depressions in the printing cylinder pattern 28 contacts the leadframe 12 and is transferred to the surface of the leadframe 12 to result in printed adhesion promoter portions 30. First portions of the leadframe (for example non-wire bond areas of the leads) receive encapsulation material adhesion promoter, while second regions (for example, wire bond areas of the leads) remain free from the material. The adhesion promoter cures (dries) before reaching the second reel 26 as a result of a solvent in the formulation of the adhesion promoter 22. Curing can be accelerated through the use of a heater, blower, UV cure, etc. (not individually depicted) at a location after the printing cylinder 16.

While this embodiment describes the use of a plurality of connected frames in tape form, it is contemplated that segmented leadframes, for example comprising eight or fewer connected frames, can be introduced into the printing apparatus in a process similar to that described above. However, to reduce handling and accommodate automated processing, processing the leadframes as a reel is believed to provide the most efficient printing of the adhesion promoter. Further, processing in reel form would allow a leadframe manufacturer to print the adhesion promoter such that the process is invisible to the semiconductor device package manufacturer.

Various adhesion promoters would function sufficiently with the embodiments described herein, such as hexamethyldisilizane (HMDS), diethylaminotrimethylsilane (DEATS), and siloxanes. A typical thickness of the adhesion promoter layer is in the range of from a few hundred angstroms to a few tens of microns.

In another embodiment as depicted in FIGS. 2a-2d, an offset tampoprint (i.e. "pad print") process is used to provide the adhesion promoter layer on the leadframe. FIG. 2a depicts a tampoprint apparatus 40 comprising a pad 42, which can be a silicone material, mounted to a piston 44. Further depicted is a rigid plate 46 having a pattern formed therein. An adhesion promoter 22 is placed on the rigid plate 46 and into the pattern. Excess material is removed, for example using a doctor blade (not individually depicted) or another known technique. The tampoprint apparatus extends the piston 44 to contact the pad 42 with the adhesion promoter 22 and the rigid plate 46 with sufficient force to transfer the adhesion promoter onto the pad 42. The piston 44 lifts the pad 42 off the rigid plate 46 as depicted in FIG. 2b.

The tampoprint apparatus transfers the pad 42 such that it overlies and aligns with the leadframe 12 or leadframe tape, which is supported by a rigid surface 48. Alternately, the rigid plate 46 can move from under the pad 42 to be replaced by the leadframe 12. In either case, the leadframe is secured into position and the piston 44 extends to contact the leadframe 12 with the adhesion promoter 22 with sufficient force to transfer the adhesion promoter 22 to the leadframe 12 as depicted in FIG. 2d.

It is contemplated that the embodiment of FIGS. 2a-2d can comprise the use of reels similar to those in structure and function described above for the FIG. 1 embodiment. Further, the FIG. 2a-2d embodiment can comprise the use of leadframe segments separate from a reel, for example a frame for a single semiconductor die, or connected frames for eight semiconductor dice. As with the previous embodiments, a leadframe handler will typically be used to assist placement of the leadframe into and through the printing apparatus.

Figure 3:
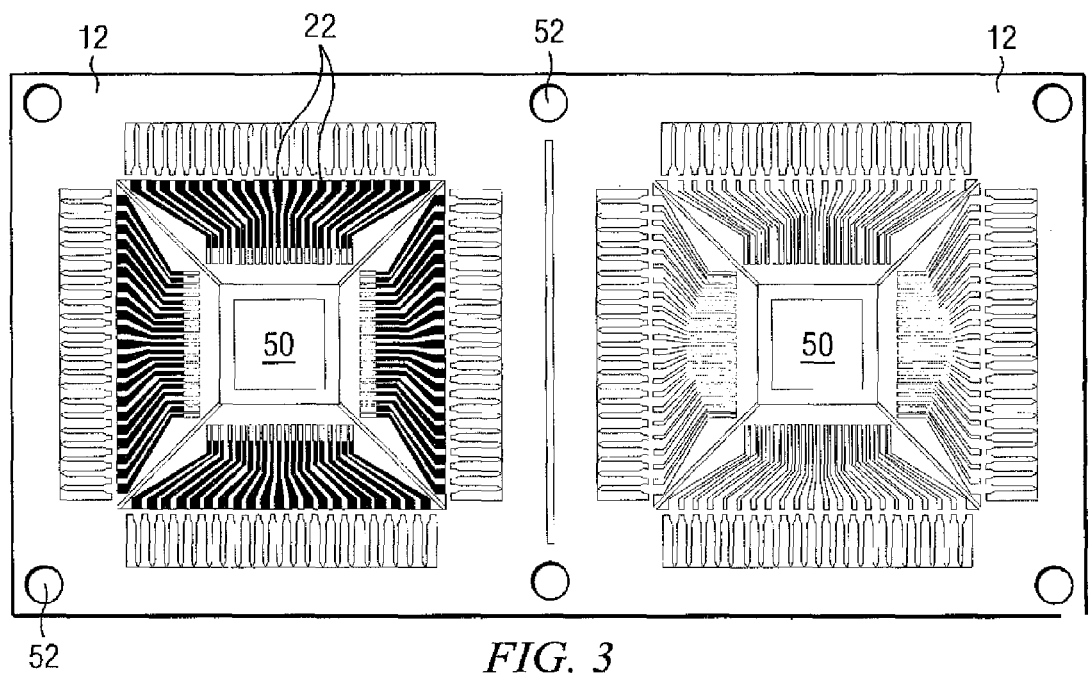
FIG. 3 is plan view depicting a two frames of a leadframe tape, wherein one frame is printed with encapsulation material adhesion promoter and the other remains unprinted.

FIG. 3 is a plan view depicting a section of a leadframe tape 12 which provides two frames. Adhesion promoter 22 has been patterned onto desired locations of the frame on the left, while the frame on the right has not been patterned and remains untreated. FIG. 3 further depicts die paddles 50 which are free of adhesion promoter to avoid interfering with attachment of the chip to the die paddle with a die adhesive.

In another embodiment, adhesion promoter is placed on both sides of the leadframe, with a different pattern on each side. For example, the adhesion promoter pattern placed on a first side (the die side) of the frame during a first pass through the printing apparatus can leave the die paddle free from adhesion promoter, while the adhesion promoter pattern placed on a second side (the back side) of the frame during a second pass through the printing apparatus can pattern adhesion promoter on the die paddle. If desired, the adhesion promoter can also be applied to the paddle to enhance adhesion between the paddle and the die attach adhesive.

Additionally, different adhesion promoters can be placed on each side of the frame during different passes through the printing apparatus (or using different cylinders or printing pads of the same printing apparatus during serial or parallel placement of the pattern on two sides of the frame).

In various embodiments, alignment of the leadframe with the printing equipment can be provided through the use of an optical camera system (not individually depicted), and/or through the use of indexing holes 52 as depicted in FIG. 3.

Thus various embodiments of the invention are able to accurately place adhesion promoter to desired locations of the leadframe without masking and with little waste of material. This results in a very low risk of contamination to untreated portions of the leadframe. Further, if the material is placed by the leadframe manufacturer, the process is transparent to the semiconductor device manufacturer, although the process also lends itself to completion by the semiconductor device manufacturer prior to die attach. Additionally, the described embodiments do not require plating (such as post-mold plating) or etching, and is compatible with current leadframe plating, such as the use of NiPdAu. Also, processes comprising the use of a different adhesion promoter pattern on each side of the leadframe, and/or the use of a different adhesion promoter formulation on each side of the leadframe, are contemplated.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method for forming a semiconductor device, comprising:
   printing an encapsulation material adhesion promoter onto a semiconductor device leadframe prior to attachment of a semiconductor die using an offset printing apparatus to print the encapsulation material adhesion promoter in a pattern to form a patterned encapsulation material adhesion promoter wherein the printing of the patterned encapsulation material adhesion promoter prints a first pattern on a first side of the leadframe during a first pass through the offset printing apparatus; and
   printing a second pattern on a second side of the leadframe during a second pass through the offset printing apparatus.

2. The method of claim 1, further comprising printing the encapsulation material adhesion promoter in a pattern using at least one of a rotogravure printing apparatus and a tampo-print printing apparatus.

3. The method of claim 1, further comprising:
   providing a semiconductor leadframe tape on a first reel;
   urging the semiconductor leadframe tape between an impression cylinder and a printing cylinder of a gravure printing apparatus to print the patterned encapsulation material adhesion promoter onto the leadframe; and
   subsequent to printing the patterned encapsulation material adhesion promoter onto the leadframe, placing the semiconductor leadframe tape onto a second reel.

4. The method of claim 1 wherein the second pattern is different from the first pattern.

5. The method of claim 1 wherein the first pattern is printed with a first encapsulation material adhesion promoter and the second pattern is printed with a second encapsulation material adhesion promoter which is different than the first encapsulation material adhesion promoter.

6. The method of claim 1 wherein:
   the second pattern is different from the first pattern; and
   the first pattern is printed with a first encapsulation material adhesion promoter and the second pattern is printed with a second encapsulation material adhesion promoter which is different than the first encapsulation material adhesion promoter.

7. A method for forming a semiconductor device, comprising:
   placing a semiconductor leadframe into an offset printing apparatus;
   advancing the semiconductor leadframe through the offset printing apparatus
   applying an encapsulation material adhesion promoter to the leadframe in a printed pattern while the semiconductor leadframe is advancing through the offset printing apparatus, wherein first portions of the leadframe have encapsulation material adhesion promoter applied thereto, and second portions of the leadframe remain free from the encapsulation material adhesion promoter, wherein the printing of the patterned encapsulation material adhesion promoter prints a first pattern on a first side of the leadframe during a first pass through the offset printing apparatus and printing a second pattern on a second side of the leadframe during a second pass through the offset printing apparatus.

8. The method of claim 7 further comprising applying the encapsulation material adhesion promoter to leads of the leadframe, wherein wire bond areas of the leads remain free from the encapsulation material adhesion promoter.

9. The method of claim 7, further comprising:

providing a semiconductor leadframe tape on a first reel;

urging the semiconductor leadframe tape between an impression cylinder and a printing cylinder of a gravure printing apparatus to print the encapsulation material adhesion promoter onto the leadframe in a pattern; and subsequent to printing the encapsulation material adhesion promoter onto the leadframe, placing the semiconductor leadframe tape onto a second reel.

10. The method of claim 7 wherein the second pattern is different from the first pattern.

11. The method of claim 7 wherein the first pattern is printed with a first encapsulation material adhesion promoter and the second pattern is printed with a second encapsulation material adhesion promoter which is different than the first encapsulation material adhesion promoter.

12. The method of claim 7 wherein:

the second pattern is different from the first pattern; and the first pattern is printed with a first encapsulation material adhesion promoter and the second pattern is printed with a second encapsulation material adhesion promoter which is different than the first encapsulation material adhesion promoter.

\* \* \* \* \*